(12) United States Patent
Gil et al.

(10) Patent No.: US 9,411,917 B2
(45) Date of Patent: Aug. 9, 2016

(54) METHODS AND SYSTEMS FOR MODELING CROWDSOURCING PLATFORM

(71) Applicant: Xerox Corporation, Norwalk, CT (US)

(72) Inventors: Alvaro E Gil, Rochester, NY (US); Guangyu Zou, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 234 days.

(21) Appl. No.: 14/225,475

(22) Filed: Mar. 26, 2014

(65) Prior Publication Data

US 2015/0278403 A1 Oct. 1, 2015

(51) Int. Cl.
*G06F 3/048* (2013.01)
*G06F 17/50* (2006.01)
*G06Q 10/06* (2012.01)
*G06Q 10/10* (2012.01)

(52) U.S. Cl.
CPC ...... *G06F 17/5009* (2013.01); *G06Q 10/06398* (2013.01); *G06Q 10/063112* (2013.01); *G06Q 10/101* (2013.01)

(58) Field of Classification Search
None
See application file for complete search history.

(56) References Cited

U.S. PATENT DOCUMENTS

| | | | | |
|---|---|---|---|---|
| 7,062,417 | B2 * | 6/2006 | Kruger | G06F 17/18 700/30 |
| 9,092,802 | B1 * | 7/2015 | Akella | G06Q 30/0256 |
| 2004/0010758 | A1 * | 1/2004 | Sarkar | G06K 9/03 715/256 |
| 2007/0014435 | A1 * | 1/2007 | Mirowski | G01V 11/00 382/109 |
| 2008/0059143 | A1 * | 3/2008 | Chiu | G06F 17/5009 703/14 |
| 2010/0199186 | A1 * | 8/2010 | Bonabeau | G06N 3/126 715/733 |
| 2011/0258560 | A1 * | 10/2011 | Mercuri | G06F 17/3089 715/753 |
| 2012/0221951 | A1 * | 8/2012 | Kidron | G06F 17/30867 715/716 |
| 2012/0232987 | A1 * | 9/2012 | Everingham | G06Q 30/0241 705/14.49 |
| 2013/0151197 | A1 * | 6/2013 | Vattathara | G06F 17/18 702/179 |
| 2013/0254651 | A1 * | 9/2013 | Lee | G06Q 30/00 715/234 |
| 2014/0237386 | A1 * | 8/2014 | Barrington | H04L 65/403 715/753 |
| 2014/0316235 | A1 * | 10/2014 | Davis | A61B 5/7246 600/407 |
| 2015/0133076 | A1 * | 5/2015 | Brough | H04W 24/10 455/405 |
| 2015/0269857 | A1 * | 9/2015 | Feng | G09B 7/00 434/353 |

OTHER PUBLICATIONS

"Estimating the Completion Time of Crowdsourced Tasks Using Survival Analysis Models"; Jing Wang, Siamak Faridani, Panagiotis G. Ipeirotis; pp. 1-4, Feb. 9, 2011.

(Continued)

*Primary Examiner* — Hua Lu
(74) *Attorney, Agent, or Firm* — Philip E. Blair; Fleit Gibbons Gutman Bongini & Bianco P.L.

(57) ABSTRACT

Methods and systems for creating statistical model. Values of at least one output parameter corresponding to each combination of values of a set of input parameters are collected. The at least one output parameter and the set of input parameters are associated with one or more crowdsourcing tasks. Each combination of the values of the set of input parameters is determined based on at least one of one or more design of experiments or a historical data. Further, a distribution of the values of the at least one output parameter is determined. The statistical model is created based on the values of the set of input parameters and one or more characteristics associated with the distribution of the values of the at least one output parameter.

27 Claims, 4 Drawing Sheets

(56) References Cited

OTHER PUBLICATIONS

"Toward Automatic Task Design: A Progress Report"; Eric Huang, Haoqi Zhang, David C. Parkes, Krzysztof Z. Gajos, Yiling Chen, pp. 1-9, Jul. 25, 2010.

"Using Kernel Density Estimates to Investigate Multimodality"; B. W. Silverman. *Journal of the Royal Statistical Society.* Series B (Methodological), vol. 43, No. 1, (1981), pp. 97-99 Published by: Blackwell Publishing for the Royal Statistical Society Stable URL: http://www.jstor.org/stable/2985156.

\* cited by examiner

METHODS AND SYSTEMS FOR MODELING CROWDSOURCING PLATFORM

TECHNICAL FIELD

The presently disclosed embodiments are related, in general, to crowdsourcing. More particularly, the presently disclosed embodiments are related to methods and systems for creating a statistical model for crowdsourcing platforms.

BACKGROUND

Crowdsourcing has emerged as a convenient and an economical method for organizations to outsource certain tasks, which require human involvement. For example, tasks such as digitization of handwritten documents, labeling of images, and anomaly detection in videos, and so on, may be uploaded by a requester on one or more crowdsourcing platforms. Crowdworkers associated with the crowdsourcing platforms may attempt such tasks.

However, crowdsourcing is a complex system, in which performance of the crowdsourcing tasks depends on various input parameters including, but not limited to, worker availability, incentive provided to the workers, compensations strategies deployed by the requesters, and so forth. Further, the performance of the crowdsourcing system may be determined through various output parameters, such as task accuracy, task completion time, task acceptance rate, etc. Various input parameters and the performance of the crowdsourcing systems are generally interdependent, and the performance optimization of the crowdsourcing systems, utilizing this sort of interdependence, has been a non-trivial problem for crowdsourcing service providers.

SUMMARY

According to embodiments illustrated herein, there is provided a method for creating a performance statistical model for an image-analysis task on a crowdsourcing platform. The method includes collecting values of at least one output parameter corresponding to each combination of values of a set of input parameters. The at least one output parameter corresponds to at least one of a task accuracy, a task completion time, or a task acceptance rate, and the set of input parameters corresponds to at least one of an task-incentive associated with the image-analysis task, a playback speed associated with the image-analysis task, a country in which the image-analysis task is posted, a lifetime of the image-analysis task, or a time available to complete the image-analysis task. The method further includes determining a distribution of the values of the at least one output parameter. The method further includes creating the performance statistical model, based on the set of input parameters and one or more characteristics associated with the distribution of the values of the at least one output parameter. The method is performed by one or more processors.

According to embodiments illustrated herein, there is provided a method for creating a performance statistical model for a crowdsourcing platform. The method includes collecting values of at least one output parameter corresponding to each combination of values of a set of input parameters. The at least one output parameter and the set of input parameters are associated with one or more crowdsourcing tasks. The each combination of the values of the set of input parameters is determined based on at least one of one or more design of experiments or a historical data. The method further includes determining a distribution of the values of the at least one output parameter. The method further includes creating the performance statistical model, based on the values of the set of input parameters and one or more characteristics associated with the distribution of the values of the at least one output parameter. The method is performed by one or more processors.

According to embodiments illustrated herein, there is provided a system for creating a performance statistical model for a crowdsourcing platform. The system includes one or more processors operable to collect values of at least one output parameter corresponding to each combination of values of a set of input parameters. The at least one output parameter and the set of input parameters are associated with one or more crowdsourcing tasks. The each combination of the values of the set of input parameters is determined based on at least one of one or more design of experiments or a historical data. The one or more processors are further operable to determine a distribution of the values of the at least one output parameter. The one or more processors are further operable to create the performance statistical model, based on the values of the set of input parameters and one or more characteristics associated with the distribution of the values of the at least one output parameter.

According to embodiments illustrated herein, there is provided a computer program product for use with a computer. The computer program product includes a non-transitory computer readable medium. The non-transitory computer readable medium stores a computer program code for creating a performance statistical model for a crowdsourcing platform. The computer program code is executable by one or more processors to collect values of at least one output parameter corresponding to each combination of values of a set of input parameters. The at least one output parameter and the set of input parameters are associated with one or more crowdsourcing tasks. Each combination of the values of the set of input parameters is determined based on at least one of one or more design of experiments or a historical data. The computer program code is further executable by the one or more processors to determine a distribution of the values of the at least one output parameter. The computer program code is further executable by the one or more processors to create the performance statistical model, based on the values of the set of input parameters and one or more characteristics associated with the distribution of the values of the at least one output parameter.

BRIEF DESCRIPTION OF DRAWINGS

The accompanying drawings illustrate various embodiments of systems, methods, and other aspects of the disclosure. Any person having ordinary skill in the art will appreciate that the illustrated element boundaries (e.g., boxes, groups of boxes, or other shapes) in the figures represent one example of the boundaries. It may be that in some examples, one element may be designed as multiple elements or that multiple elements may be designed as one element. In some examples, an element shown as an internal component of one element may be implemented as an external component in another, and vice versa. Furthermore, elements may not be drawn to scale.

Various embodiments will hereinafter be described in accordance with the appended drawings, which are provided to illustrate, and not to limit the scope in any manner, wherein like designations denote similar elements, and in which.

DETAILED DESCRIPTION

Figure 1:
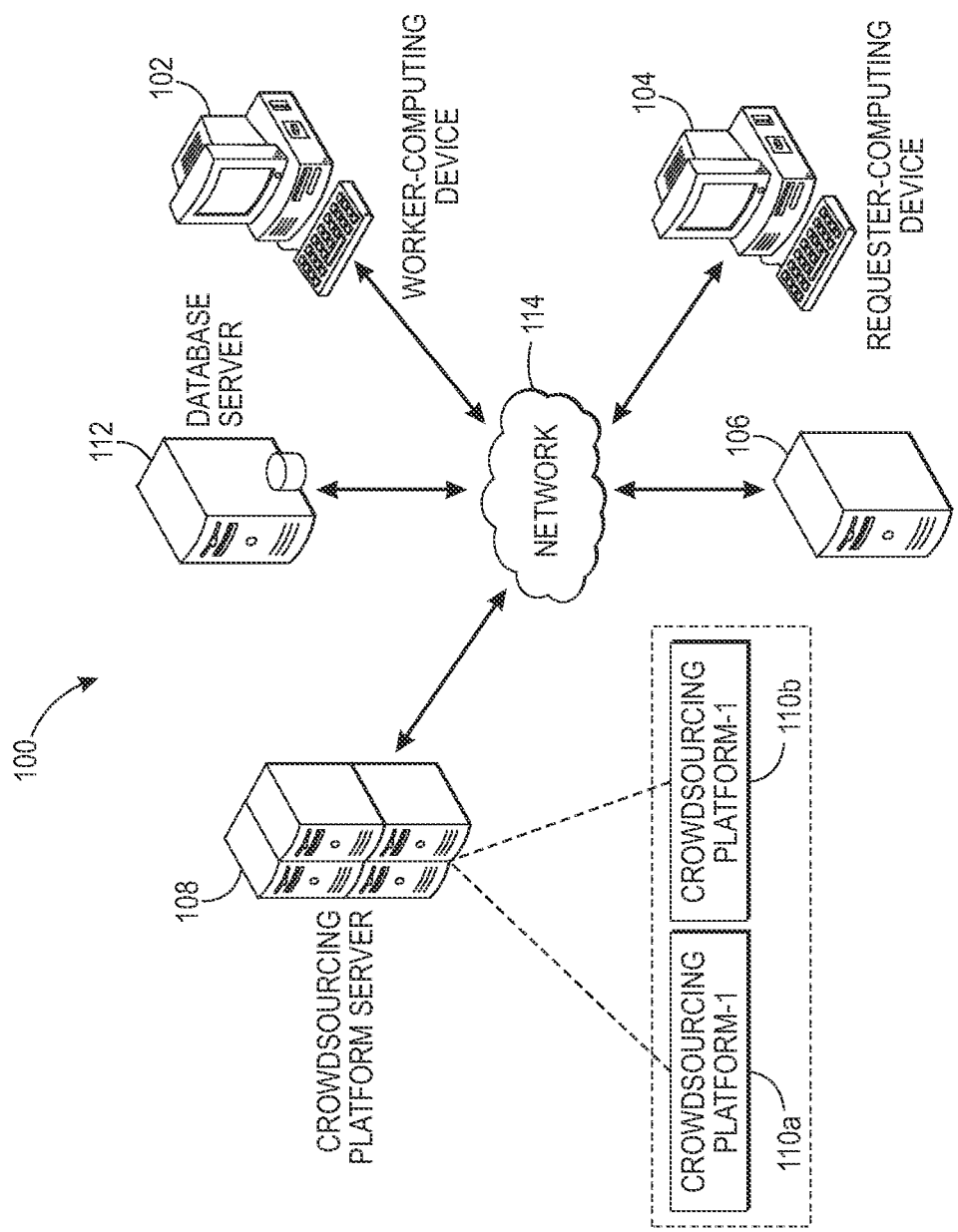
FIG. 1 is a block diagram illustrating a system environment in which various embodiments may be implemented.

The present disclosure is best understood with reference to the detailed figures and description set forth herein. Various embodiments are discussed below with reference to the figures. However, those skilled in the art will readily appreciate that the detailed descriptions given herein with respect to the figures are simply for explanatory purposes as the methods and systems may extend beyond the described embodiments. For example, the teachings presented and the needs of a particular application may yield multiple alternate and suitable approaches to implement the functionality of any detail described herein. Therefore, any approach may extend beyond the particular implementation choices in the following embodiments described and shown.

References to "one embodiment", "an embodiment", "at least one embodiment", "one example", "an example", "for example" and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

DEFINITIONS

The following terms shall have, for the purposes of this application, the respective meanings set forth below.

"Crowdsourcing" refers to distributing tasks (hereinafter, also referred to as crowdsourcing tasks) by soliciting the participation of loosely defined groups of individual crowdworkers. A group of crowdworkers may include, for example, individuals responding to a solicitation posted on a certain website such as, but not limited to, Amazon Mechanical Turk, Crowd Flower, or Mobile Works.

A "crowdsourcing platform" refers to a business application, wherein a broad, loosely defined external group of people, communities, or organizations provide solutions as outputs for any specific business processes received by the application as inputs. In an embodiment, the business application may be hosted online on a web portal (e.g., crowdsourcing platform servers). Examples of the crowdsourcing platforms include, but are not limited to, Amazon Mechanical Turk, Crowd Flower, or Mobile Works.

A "crowdworker" refers to a workforce/worker(s) that may perform one or more tasks that generate data that contributes to a defined result. With reference to the present disclosure, the crowdworker(s) includes, but is not limited to, a satellite center employee, a rural business process outsourcing (BPO) firm employee, a home-based employee, or an internet-based employee. Hereinafter, the terms "crowdworker", "worker", "remote worker", "crowdsourced workforce", and "crowd" may be used interchangeably.

A "crowdsourcing task" refers to a piece of work, an activity, an action, a job, an instruction, or an assignment to be performed. Crowdsourcing tasks may necessitate the involvement of one or more workers. Examples of tasks may include, but are not limited to, an image/video/text labelling/tagging/categorisation, language translation, data entry, handwriting recognition, product description writing, product review writing, essay writing, address look-up, website look-up, hyperlink testing, survey completion, consumer feedback, identifying/removing vulgar/illegal content, duplicate checking, problem solving, user testing, video/audio transcription, targeted photography (e.g. of product placement), text/image analysis, directory compilation, or information search/retrieval.

"Input parameters" refer to one or more parameters corresponding to at least one of a crowdsourcing platform, a crowdworker, crowdsourcing tasks, or a requester. Examples of the input parameters may include, but are not limited to, an incentive associated with the tasks, a country in which the tasks are attempted, a lifetime of the tasks, a time available to complete the tasks, days of a week on which the tasks are attempted, time of the days when tasks are attempted, recurrence of the tasks, skill set associated with crowdworkers, availability of the crowdworkers, motivation of the crowdworkers, intentions of the crowdworkers in performing the tasks, and difficulty levels of the tasks. In a scenario, where the crowdsourcing tasks correspond to video tagging, the input parameters may also include at least one of playback speed associated with the audio/video clips included in the tasks, duration of the audio/video clips included in the tasks, or a resolution of the videos included in the tasks.

"Output parameters" refer to one or more parameters that depict performance associated with one or more crowdsourcing tasks. In an embodiment, the output parameters may include, but are not limited to, task accuracy, task completion time, or task acceptance rate.

A "distribution" refers to a spread of the values of the at least one output parameter, when the values of the at least one output parameter are plotted in a graphical form. In an embodiment, the distribution of the values of the output parameters may correspond to a probabilistic distribution, in which the probable values of the output parameters are collected, and, subsequently, their distribution is determined. Examples of the distribution may include, but are not limited to, Exponential Distribution, an Extreme Value Distribution, a Lognormal Distribution, a Normal Distribution, a Rayleigh Distribution, a Beta Distribution, an F distribution, a Gamma Distribution, or a Weibull Distribution.

A "modality" of the distribution corresponds to instances of peak values observed, when the values of the output parameters are plotted in a graphical form. For example, the values of the output parameters corresponding to the values of a set of input parameters may be plotted in the form of a histogram, and subsequently, modality of the distribution may be determined based on number of peaks observed in the histogram. It will be understood by a person skilled in the art that other types of the graphs may also be used to determine the modality. In an embodiment, the modality of the distribution may correspond to at least one of a unimodal distribution, a bimodal distribution, or a multimodal distribution.

"One or more characteristics" refer to one or more parameters associated with a distribution of the values of the one or more output parameters associated with the crowdsourcing tasks. Examples of the one or more characteristics may include, but are not limited to, a shape of the distribution (e.g., alpha, beta, or k), a rate parameter of the distribution (e.g., lambda), a location parameter of the distribution (e.g., mean), a scale parameter of the distribution (e.g., standard deviation, theta, or lambda), d1/d2 parameter of the distribution, and so forth.

"One or more design of experiments" refer to statistical methods that are utilized to determine a set of input parameters, from the one or more input parameters. In an embodiment, the one or more design of experiments are determinable of a number of replicas/observations of the values of the set of input parameters. Examples of the one or more design of experiments may include, but are not limited to, Full Factorial Method, Central Composite Design method, Pseudo-Monte Carlo Sampling method, Latin Hypercube Sampling method, Orthogonal Array Sampling method, and so forth.

"A statistical model" refers to a set of one or more rules that depict the relationship between the set of input parameters and the one or more characteristics associated with the distribution of the values of the one or more output parameters. In an embodiment, the statistical model may be utilized to determine a distribution of the values of the one or more output parameters. The statistical model may be created based on a regression method. A person having ordinary skill in the art would understand that other methods than regression may also be used for creating the statistical model. In an embodiment, the statistical model corresponds to a performance statistical model.

FIG. 1 is a block diagram illustrating a system environment 100 in which various embodiments may be implemented. The system environment 100 includes a worker-computing device 102, a requester-computing device 104, an application server 106, a crowdsourcing platform server 108, a database server 112, and a network 114. Various devices in the system environment 100 (e.g., the worker-computing device 102, the requester-computing device 104, the application server 106, the crowdsourcing platform server 108, and the database server 112) may be interconnected over the network 114.

The worker-computing device 102 refers to a computing device, used by a crowdworker, to perform one or more tasks. In an embodiment, the worker-computing device 102 receives a user interface (UI) (e.g., through a web-interface) from the crowdsourcing platform server 108. The one or more tasks may be presented to the crowdworker through the UI. Subsequently, the crowdworker may submit the response to the one or more tasks through the UI. The crowdworker may provide the response using one or more input devices (e.g., keyboard, mouse, touch-interface, etc.) associated with the worker-computing device 102. In an alternate embodiment, the crowdworker may perform the one or more tasks through a client application provided by the crowdsourcing platform server 108. The worker-computing device 102 may include a variety of computing devices, such as a desktop, a laptop, a personal digital assistant (PDA), a tablet computer, and the like.

The requester-computing device 104 may refer to a computing device, used by the requester, to upload information pertaining to the one or more tasks. In an embodiment, the requester may access the crowdsourcing platform server 108 to upload the information pertaining to the one or more tasks. For example, if the crowdsourcing tasks correspond to digitization of handwritten documents, the requester may upload electronic documents (e.g., scanned copies of the handwritten document) on the crowdsourcing platform server 108. In a similar way, if the crowdsourcing tasks correspond to video tagging, the requester may upload the respective videos on the crowdsourcing platform server 108. In an embodiment, using the requester-computing device 104, the requester may provide information pertaining to the one or more input parameters associated with the one or more crowdsourcing tasks. For example, the requester may provide an expected task completion time, incentives for the one or more crowdsourcing tasks, and so forth. In an embodiment, the requester may also provide one or more output parameters that he/she wants to observe/optimize. The requester-computing device 104 may include a variety of computing devices, such as a desktop, a laptop, a personal digital assistant (PDA), a tablet computer, and the like.

The application server 106 refers to a computing device that creates the statistical model. In an embodiment, the application server 106 identifies one or more design of experiments. The one or more design of experiments may be identified based on the input and output parameters provided by the requester. In an alternate embodiment, the one or more design of experiments may be provided by the requester. Further, the application server 106 may determine a set of input parameters based on the one or more design of experiments. In an embodiment, the application server 106 may collect the values of the one or more output parameters corresponding to the values of the set of input parameters. Subsequently, the application server 106 may collect a distribution of the values of the one or more output parameters. The application server 106 may determine one or more characteristics associated with the distribution of the values of the one or more output parameters. It will be apparent to a person skilled in the art that the one or more characteristics will depend on the determined distribution of the values of the one or more output parameters. Based on the values of the set of input parameters and the one or more characteristics of the distribution of the values of the one or more output parameters, the application server 106 may create the statistical model. Further illustrations and details about the creation of the statistical model have been discussed in conjunction with the FIG. 3. The application server 106 may be realized through various types of application servers such as, but not limited to, Java application server, .NET framework, and Base4 application server.

The crowdsourcing platform server 108 may refer to a device or a computer that hosts one or more crowdsourcing platforms (e.g., crowdsourcing platform-1 110a and crowdsourcing platform-2 110b, depicted in the system environment 100). The crowdsourcing platform server 108 may communicate the one or more tasks to the one or more crowdworkers associated with the crowdsourcing platform. In an embodiment, the crowdsourcing platform server 108 presents the user interface (UI) on the worker-computing device 102 through the web based interface. In an alternate embodiment, the crowdsourcing platform server 108 may provide the client application that may be installed on the worker-computing device 102 for executing the one or more tasks. The one or more crowdworkers may access the one or more tasks through the web based interface or the client application. Further, the one or more crowdworkers may submit a final response for the tasks to the crowdsourcing platform server 108. The crowdsourcing platform server 108 may be realized through various types of application servers such as, but not limited to, Java application server, .NET framework, and Base4 application server.

The database server 112 may refer to a device or a computer that maintains a repository of the tasks assigned to the crowdworkers. In an embodiment, the database server 112 may store the values of the input and the output parameters received from the requester. Further, in an embodiment, the database server 112 may store the one or more characteristics associated with the distribution of the values of one or more output parameters. In an embodiment, the database server 112 may receive such information from the application server 106. Further, the database server 112 may receive a query from at least one of the application server 106 or the crowdsourcing platform server 108. For querying the database server 112, one or more querying languages may be utilized such as, but not limited to, SQL, QUEL, DMX and so forth. Further, the database server 112 may be realized through various technologies such as, but not limited to, Microsoft® SQL server, Oracle, and My SQL. In an embodiment, the database server 112 may connect to at least one of the application server 106 or the crowdsourcing platform server 108, using one or more protocols such as, but not limited to, ODBC protocol and JDBC protocol.

It will be apparent to a person skilled in the art that the functionalities of the database server 112 may be incorporated into the application server 106, without departing from the scope of the disclosure. Further, the functionalities of the application server 106 and the database server 112 may, collectively, be incorporated into the crowdsourcing platform server 108.

The network 114 corresponds to a medium through which content and messages flow between various devices of the system environment 100 (e.g., the worker-computing device 102, the requester-computing device 104, the application server 106, the crowdsourcing platform server 108, and the database server 112). Examples of the network 114 may include, but are not limited to, a Wireless Fidelity (Wi-Fi) network, a Wide Area Network (WAN), a Local Area Network (LAN), or a Metropolitan Area Network (MAN). Various devices in the system environment 100 can connect to the network 114 in accordance with various wired and wireless communication protocols such as Transmission Control Protocol and Internet Protocol (TCP/IP), User Datagram Protocol (UDP), and 2G, 3G, or 4G communication protocols.

Figure 2:
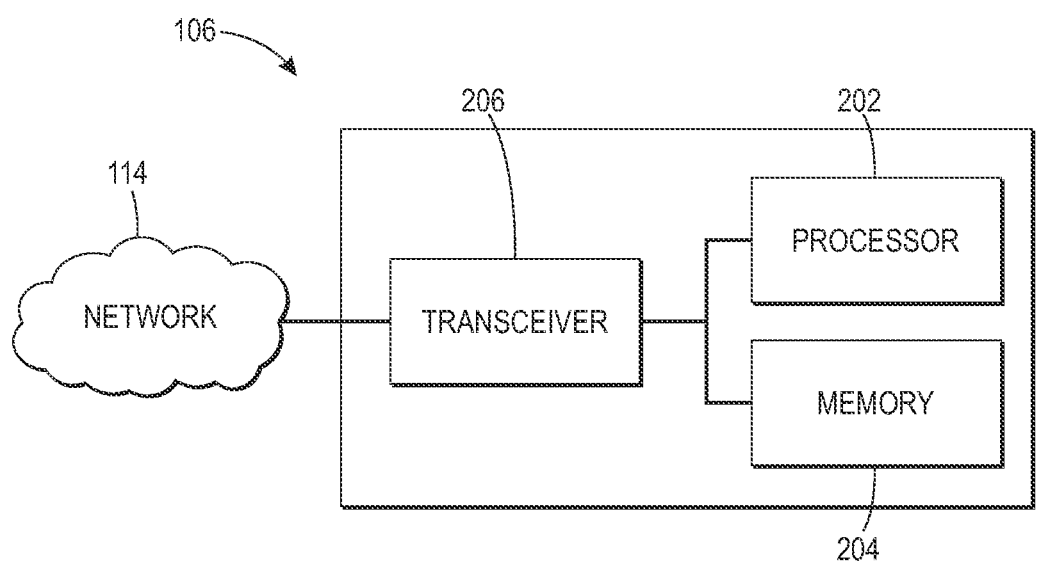
FIG. 2 is a block diagram illustrating an application server for creating a statistical model, in accordance with at least one embodiment.

FIG. 2 is a block diagram illustrating the application server 106, in accordance with at least one embodiment. The application server 106 includes a processor 202, a memory 204, and a transceiver 206.

The processor 202 is coupled to the memory 204 and the transceiver 206. The processor 202 includes suitable logic, circuitry, and/or interfaces that are operable to execute one or more instructions stored in the memory 204 to perform predetermined operation. The memory 204 may be operable to store the one or more instructions. The processor 202 may be implemented using one or more processor technologies known in the art. Examples of the processor 202 include, but are not limited to, an X86 processor, a RISC processor, an ASIC processor, a CISC processor, or any other processor.

The memory 204 stores a set of instructions and data. Some of the commonly known memory implementations include, but are not limited to, a random access memory (RAM), a read only memory (ROM), a hard disk drive (HDD), and a secure digital (SD) card. Further, the memory 204 includes the one or more instructions that are executable by the processor 202 to perform specific operations. It is apparent to a person having ordinary skills in the art that the one or more instructions stored in the memory 204 enables the hardware of the application server 106 to perform the predetermined operation.

The transceiver 206 transmits and receives messages and data to/from various components of the system environment 100. Examples of the transceiver 206 may include, but are not limited to, an antenna, an Ethernet port, an USB port or any other port that can be configured to receive and transmit data. The transceiver 206 transmits and receives data/messages in accordance with the various communication protocols, such as, TCP/IP, UDP, and 2G, 3G, or 4G communication protocols.

Figure 3:
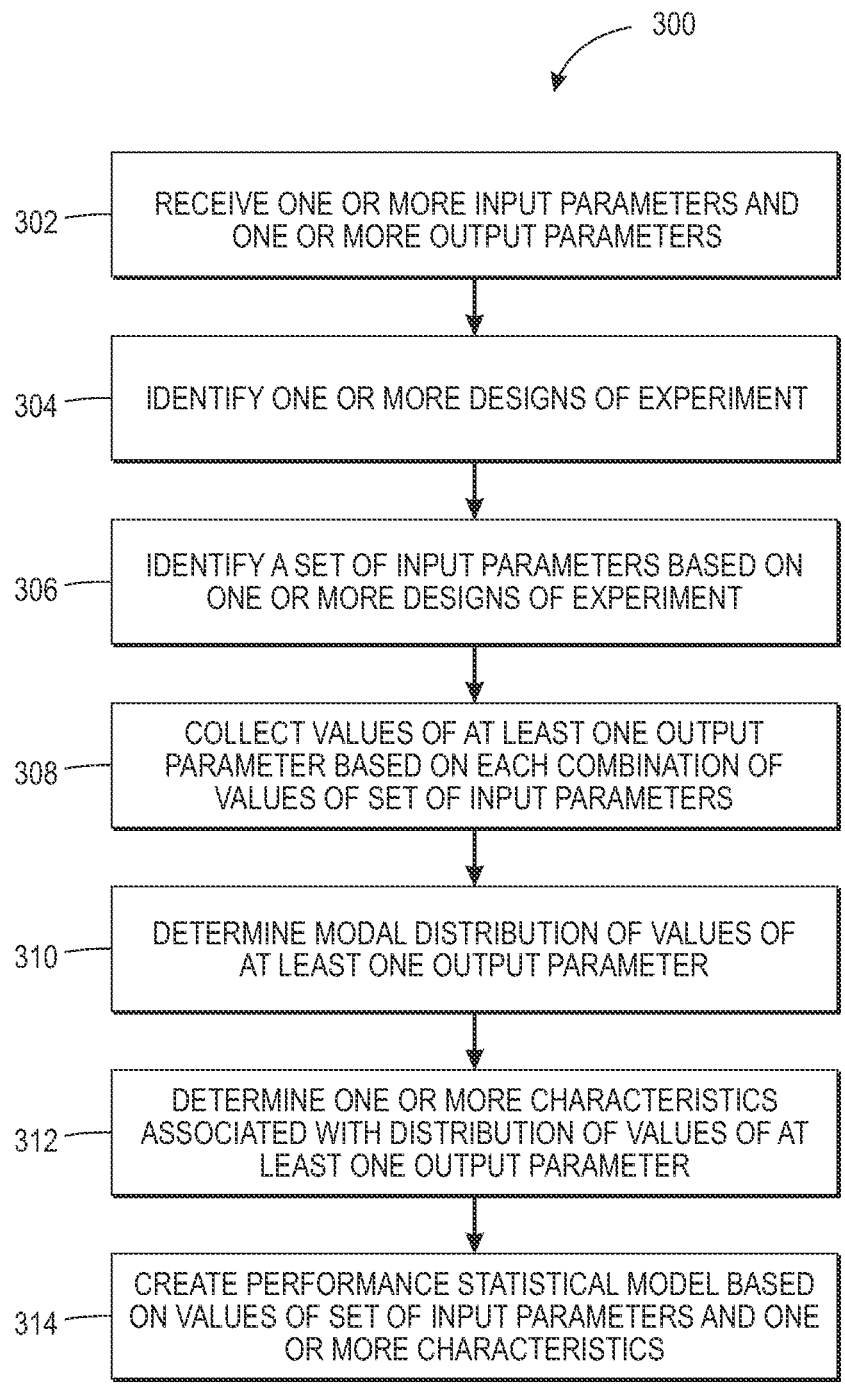
FIG. 3 is a flowchart illustrating a method for creating the statistical model, in accordance with at least one embodiment.

The operation of the application server 106 for creating the statistical model has been described in conjunction with FIG. 3.

FIG. 3 is a flowchart 300 illustrating a method for creating the statistical model, in accordance with at least one embodiment. The flowchart 300 is described in conjunction with FIG. 1 and FIG. 2.

At step 302, the one or more input parameters and the one or more output parameters are received. The processor 202 may receive these parameters. In an embodiment, the requester may provide the one or more input parameters and the one or more output parameters that need to be modeled. For example, the requester may wish to observe/analyze how accuracy of the tasks performed by the crowdworkers varies with the incentive provided for the tasks. In an embodiment, the one or more input parameters may correspond to, but are not limited to, an incentive associated with the tasks, a country in which the tasks are attempted, a lifetime of the tasks, a time available to complete the tasks, days of a week on which the tasks are attempted, time of the days when tasks are attempted, recurrence of the tasks, and difficulty levels of the tasks. Further, in an embodiment, the input parameters may include one or more parameters that indicate behavioral characteristics associated with the crowdworker. For example, the behavioral characteristics may include skill set associated with crowdworkers, availability of the crowdworkers to perform to the tasks, motivation of the crowdworkers, intentions of the crowdworkers in performing the tasks, and so forth. The incentive associated with the tasks may correspond to a monetary reward (e.g., cash) paid for the crowdsourcing tasks. In an embodiment, the incentive associated with the tasks may also correspond to other forms of rewards, such as, but not limited to, gift cards, gift coupons, lottery tickets, etc. Further, in an embodiment, the incentive associated with the tasks may correspond to strengthening the relationship between the crowdworkers and the requesters, or the prospects of better rewards on completion of the tasks. The lifetime of the tasks refers to a time for which the tasks are available on the crowdsourcing platform. The time available to complete the tasks refers to a time in which the requester expects the tasks to be completed by the crowdworkers. Further, the day of a week may correspond to a weekday or a weekend, and the time of the day may correspond to a time (e.g., day hours, evening hours etc.) when the tasks are attempted. Recurrence of the tasks indicates whether the task is posted for the first time, or is a repeated task. Difficulty levels associated with the tasks may correspond to rating provided to the tasks (e.g. on the crowdsourcing platform) in terms of difficulty level. Further, motivation of the crowdworker may correspond to the fact whether the crowdworker attempts the task only for earning purpose, only for learning purpose, or for both. Similarly, intentions of the crowdworker may depict the scenarios where the crowdworker tries to fool the system by providing wrong responses (e.g., to speed up the execution). It will be apparent to a person skilled in the art that all of these input parameters may affect the performance of the crowdworkers in performing the one or more tasks.

In a scenario, where the crowdsourcing task corresponds to a video tagging task, the one or more input parameters may further include at least one of playback speed associated with the audio/video clips included in the tasks, duration of the audio/video clips included in the tasks, or a resolution of the videos included in the tasks. It will be apparent to a person skilled in the art that these input parameters may affect the performance (e.g., accuracy) of the tasks attempted by the crowdworkers.

In an embodiment, the one or more output parameters may include, but are not limited to, a task accuracy, a task completion time, and a task acceptance rate. It will be apparent to a person skilled in the art that these output parameters may depict the performance of the crowdsourcing platform.

At step 304, the one or more design of experiments are identified. The processor 202 identifies the one or more design of experiments. In an embodiment, the processor 202 may identify the one or more design of experiments based on the input and output parameters provided by the requester. For example, if the requester provides one or more input parameters and wants to analyze a subset of those input parameters, the processor 202 may determine the one or more design of experiments that are capable to screen/reduce the number of parameters. In an embodiment, the one or more design of experiments identified by the processor 202 may correspond to at least one of Full Factorial method, Central Composite Design method, Pseudo-Monte Carlo Sampling method, Latin Hypercube Sampling method, Orthogonal Array Sampling method, Plackett-Burman method, Taguchi methods, and so forth. Further, in an alternate embodiment, the processor 202 may receive an input indicating the selection of a design of experiment, from the one or more design of experiments.

At step 306, a set of input parameters is identified from the one or more input parameters. The processor 202 may identify the set of input parameter based on the one or more design of experiments. For example, the one or more design of experiments may reduce the one or more input parameters to obtain the set of input parameters. The processor 202 may obtain the set of input parameters through the methods, such as Bayesian Information Criteria (BIC), Akaike Information Criteria (AIC), etc. In an alternate embodiment, the processor 202 may determine the set of input parameters, based on a historical data. In such a scenario, the processor 202 may observe the execution of the one or more crowdsourcing tasks on the crowdsourcing platform to generate the historical data. Subsequently, the processor 202 may identify the set of input parameter from the historical data. Further, the processor 202 may obtain the values associated with the set of input parameters from the historical data that includes the information pertaining to the execution of the tasks previously executed by the crowdsourcing platform server 108.

In an embodiment, corresponding to a task of video analysis, the processor 202 identifies the set of parameters as Incentive for the tasks, video playback speed, country in which the tasks are attempted, task lifetime, and time available to complete the tasks. Table 1 illustrates the set of input parameters and various combinations of the values of the set of input parameters:

TABLE 1

Illustration of values of the set of input parameters

| Sr. No. | Incentive | Video Speed | Country | Task Lifetime | Time Available |
|---|---|---|---|---|---|
| 1 | 0.1 | 16 | −1 | 3 | 12 |
| 2 | 0.1 | 16 | −1 | 36 | 1 |
| 3 | 0.1 | 16 | 1 | 3 | 1 |
| 4 | 0.1 | 16 | 1 | 36 | 12 |
| 5 | 0.1 | 32 | −1 | 3 | 1 |
| 6 | 0.1 | 32 | −1 | 36 | 12 |
| 7 | 0.1 | 32 | 1 | 3 | 12 |
| 8 | 0.1 | 32 | 1 | 36 | 1 |
| 9 | 1 | 16 | −1 | 3 | 1 |
| 10 | 1 | 16 | −1 | 36 | 12 |
| 11 | 1 | 16 | 1 | 3 | 12 |
| 12 | 1 | 16 | 1 | 36 | 1 |
| 13 | 1 | 32 | −1 | 3 | 12 |
| 14 | 1 | 32 | −1 | 36 | 1 |
| 15 | 1 | 32 | 1 | 3 | 1 |
| 16 | 1 | 32 | 1 | 36 | 12 |

Further, in an embodiment, the design of experiment determined by the processor 202, for the task of video analysis, is Full Factorial method. The Full Factorial method may determine a number of observations that need to be observed for each combination of the values of the input parameter. For example, the Full factorial method may determine that corresponding to each of the 16 combinations of the 5 values of the input parameters (refer Table 1), 25 observations are to be taken.

At step 308, values of at least one output parameter, from the one or more output parameters, are collected. The processor 202 collects the values of the at least one output parameter corresponding to each of combination of the values of the set of input parameters. In an embodiment, the processor 202 may observe the execution of the crowdsourcing tasks on the crowdsourcing platform server 108 to collect the values of the output parameters.

Considering the illustration of values, as presented in Table 1, the processor 202 may collect the values of the at least one output parameter (e.g., accuracy) corresponding to each of the 16 combination of the 5 input parameters. For example, the processor may collect the value of accuracy for row 1 (i.e., the combination: 0.1, 16, −1, 3, and 12). In a similar way, the processor 202 may collect the values of the accuracy for other 15 rows. Further, in an embodiment, the processor 202 may collect the values of the accuracy for each of the 25 observations corresponding to 16 combinations. A person having ordinary skill in the art would understand that the scope of the disclosure is not limited to 25 observations, and the number 25 is provided just for illustration purpose. Further, in an embodiment, the number 25 is determined based on the design of experiment identified in the step 304. Table 2 illustrates such a scenario, where 25 values for accuracy are collected, corresponding to 25 observations of first combination (i.e., row 1) of Table 1:

TABLE 2

Illustration of the values of the output parameter for one combination of values of input parameter

| | Set of input parameters | | | | | Output |
|---|---|---|---|---|---|---|
| Sr. No. | Incentive | Video Speed | Country | Task Lifetime | Time Available | parameter Accuracy |
| 1 | 0.1 | 16 | −1 | 3 | 12 | 0.8423 |
| 2 | 0.1 | 16 | −1 | 3 | 12 | 0.8152 |
| 3 | 0.1 | 16 | −1 | 3 | 12 | 0.8021 |
| 4 | 0.1 | 16 | −1 | 3 | 12 | 0.8632 |
| 5 | 0.1 | 16 | −1 | 3 | 12 | 0.8222 |
| 6 | 0.1 | 16 | −1 | 3 | 12 | 0.8444 |
| 7 | 0.1 | 16 | −1 | 3 | 12 | 0.7685 |
| 8 | 0.1 | 16 | −1 | 3 | 12 | 0.7896 |
| 9 | 0.1 | 16 | −1 | 3 | 12 | 0.7412 |
| 10 | 0.1 | 16 | −1 | 3 | 12 | 0.9586 |
| 11 | 0.1 | 16 | −1 | 3 | 12 | 0.8562 |
| 12 | 0.1 | 16 | −1 | 3 | 12 | 0.8745 |
| 13 | 0.1 | 16 | −1 | 3 | 12 | 0.7698 |
| 14 | 0.1 | 16 | −1 | 3 | 12 | 0.8523 |
| 15 | 0.1 | 16 | −1 | 3 | 12 | 0.8333 |
| 16 | 0.1 | 16 | −1 | 3 | 12 | 0.9256 |
| 17 | 0.1 | 16 | −1 | 3 | 12 | 0.7458 |
| 18 | 0.1 | 16 | −1 | 3 | 12 | 0.8963 |
| 19 | 0.1 | 16 | −1 | 3 | 12 | 0.8529 |
| 20 | 0.1 | 16 | −1 | 3 | 12 | 0.7833 |
| 21 | 0.1 | 16 | −1 | 3 | 12 | 0.7911 |
| 22 | 0.1 | 16 | −1 | 3 | 12 | 0.9100 |
| 23 | 0.1 | 16 | −1 | 3 | 12 | 0.9400 |
| 24 | 0.1 | 16 | −1 | 3 | 12 | 0.6789 |
| 25 | 0.1 | 16 | −1 | 3 | 12 | 0.8351 |

As can be observed from Table 2, a set of 25 values of accuracy is obtained corresponding to the one combination of values of input parameters. It will be understood by a person skilled in the art that similar results (i.e., set of 25 values) may also be obtained for the other rows of values illustrated in Table 1.

At step 310, a distribution of the values of the at least one output parameter is collected. The processor 202 determines the distribution of the values of the at least one output parameter. In an embodiment, post collecting the values of the at least one output parameter, the processor 202 may determine what type of probabilistic distribution the values of the at least one parameter follows. That is, the processor 202 determines the best fit for the distribution of the values of the at least one output parameter. The processor 202 may determine the best fit from different types of the probabilistic distributions. Examples of such distributions may include, but are not limited to, Exponential Distribution, an Extreme Value Distribution, a Lognormal Distribution, a Normal Distribution, a Rayleigh Distribution, a Beta Distribution, an F distribution, a Gamma Distribution, or a Weibull Distribution. Further, in an embodiment, prior to determining the probabilistic distribution, the processor 202 may determine a modality of the distribution of the values of the output parameters. That is, the processor 202 may determine whether the distribution is unimodal, bimodal, or multimodal. In an embodiment, the processor 202 may identify the modality of the distribution by analyzing a graph (e.g., histogram) of the values of the output parameters and the values of the input parameters.

In an embodiment, the processor 202 determines the distribution of the values of the output parameter corresponding to each combination (i.e., each row) of values of input parameters. For example, referring Table 2, the processor 202 may determine the distribution of the 25 values of the accuracy corresponding to the row 1 of Table 1. In an embodiment, the processor 202 determines that the 25 values follow a Lognormal distribution.

At step 312, one or more characteristics associated with the distribution of the values of the at least one output parameter are determined. The processor 202 determines the one or more characteristics. The processor 202 may determine different types of the characteristics such as, but not limited to, a shape of the distribution (e.g., alpha, beta, or k), a rate parameter of the distribution (e.g., lambda), a location parameter of the distribution (e.g., mean), a scale parameter of the distribution (e.g., standard deviation, theta, or lambda), or d1/d2 parameter of the distribution. Further, the types of the one or more characteristics determined by the processor 202 may depend on the type of the distribution determined in conjunction with the step 310. For example, the one or more characteristics associated with the Lognormal Distribution may correspond to the location parameter of the distribution (mean) and the scale parameter of the distribution (e.g., standard deviation, theta, or lambda); whereas, the one or more characteristics associated with the Exponential Distribution may correspond to the rate parameter of the distribution (lambda). In an embodiment, the processor 202 determines the one or more characteristics using a maximum likelihood estimate.

In an embodiment, referring to Table 1 and Table 2 (where the determined distribution was Lognormal Distribution), the processor 202 determines the characteristics (location and scale) for each row of Table 1. Table 3 illustrates the values of these characteristics determined by the processor 202:

TABLE 3

Illustrations of characteristics associated with the distribution of the output parameters

| Sr. No | Location (mean) | Scale (standard deviation) |
|---|---|---|
| 1 | −5.523 | 5 |
| 2 | −5.331 | 4 |
| 3 | −9.712 | 3 |
| 4 | −5.731 | 4 |
| 5 | −5.269 | 5 |
| 6 | −8.259 | 3 |
| 7 | −8.164 | 4 |
| 8 | −6.843 | 5 |
| 9 | −6.009 | 4 |
| 10 | −6.531 | 4 |
| 11 | −6.272 | 4 |
| 12 | −6.766 | 4 |
| 13 | −7.689 | 4 |
| 14 | −7.117 | 4 |
| 15 | −7.461 | 4 |
| 16 | −7.821 | 4 |

As can be observed from Table 3 that corresponding to each of the 16 rows of Table 1, two characteristics (i.e., location and scale) have been determined. It will be understood by a person skilled in the art that each of the characteristics corresponds to 25 observations for that row. For example, the value −5.523 and 5 for the location and scale, respectively, for the distribution of accuracy corresponds to 25 values of the accuracies collected for row 1. Similarly, the values −5.331 and 4 for the location and scale, respectively, for the distribution of accuracy corresponds to 25 values of the accuracies collected for row 2. In an embodiment, these identified characteristics may be utilized for creating the statistical model, as described below.

At step 314, the statistical model is created. The processor 202 may utilize the values of the set of input parameters (e.g., as depicted in Table 1) and the one or more characteristics (e.g., as depicted in Table 3) to determine the statistical model. In an embodiment, the processor 202 may utilize regression methods to determine the relationship between the values of the set of input parameters and the one or more characteristics of the distribution. Thus, given a combination of values of the input parameters, the processor 202 may determine the values of the one or more characteristics, based on the statistical model. In an embodiment, the processor 202 may determine coefficients of the regression model to determine such relationship.

Thus, referring to Table 1, Table 2, and Table 3, the processor 202 may determine how location and scale vary with the combination of the values of input parameters. That is, based on any given combination of the values of the input parameters, the processor 202 may determine the corresponding location and scale of the at least one output parameter.

In an embodiment, the statistical model may be utilized to derive one or more rules for an agent based model (ABM). The one or more rules for the ABM may correspond to at least one of a time for a crowdworker to search for the one or more crowdsourcing tasks, a decision of the crowdworker to accept the one or more crowdsourcing tasks, a quality of the one or more crowdsourcing tasks performed by the crowdworker, a completion time of the image-analysis task performed by the crowdworker, a number of the crowdworkers interested in performing the one or more crowdsourcing tasks, or information associated with the crowdworker. For example, the processor 202 may determine rules corresponding to the time that the crowdworkers utilize to search for the one or more crowdsourcing tasks in the crowdsourcing platform.

Figure 4:
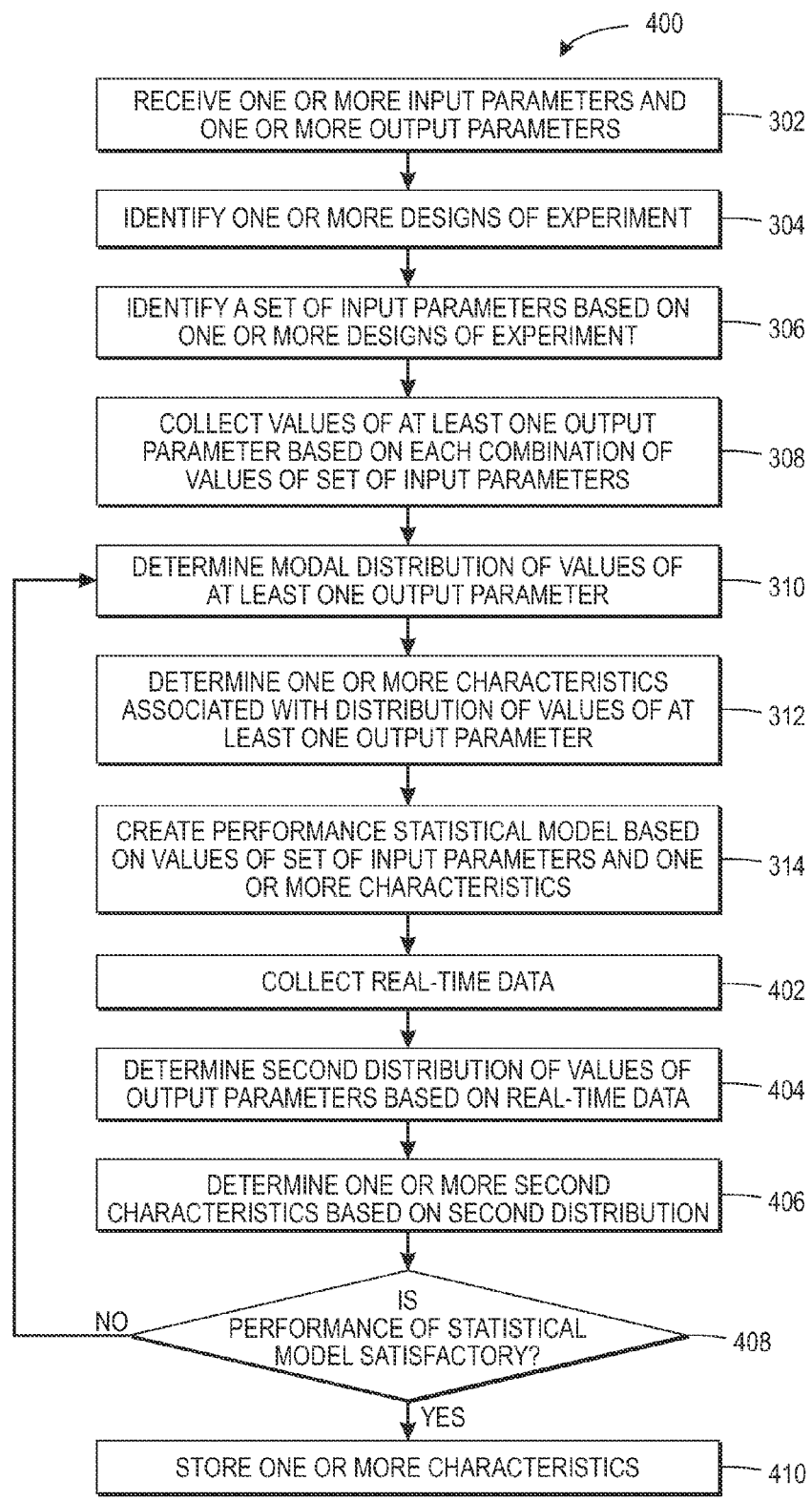
FIG. 4 is a flowchart illustrating a method for validating the statistical model, in accordance with at least one embodiment

FIG. 4 is a flowchart 400 illustrating a method for validating the statistical model, in accordance with at least one embodiment. In an embodiment, the statistical model created in conjunction with the FIG. 3, may be assessed in terms of goodness of the estimated distribution of the values of the output parameters. The flowchart 400 is described in conjunction with FIG. 1, FIG. 2, and FIG. 3.

The steps 302 to 314 have already been explained in conjunction with FIG. 3.

At step 402, real-time data is collected. The processor 202 collects the real-time data as the one or more crowdsourcing tasks are executed on the crowdsourcing platform. In an embodiment, the processor 202 may collect the values of the output parameters, corresponding to different input parameters, from the real-time data. For example, the processor 202 may collect the accuracy (for different types of the tasks) corresponding to different combinations of the input parameters.

At step 404, a second distribution of the values of the observed output parameters is determined. For example, the processor 202 may determine a second distribution of the accuracy, based on the collected real-time data. The processor 202 may determine the second distribution in a similar way, as disclosed in conjunction with the step 310.

At step 406, one or more second characteristics associated with the second distribution are determined. The processor 202 may determine the one or more second characteristics associated with the second distribution in a similar way, as disclosed in conjunction with the step 312.

At step 408, it is determined whether the performance of the statistical model (determined in conjunction with the FIG. 3) is satisfactory. In an embodiment, to determine this, the processor 202 may compare the one or more characteristics, determined in conjunction with the step 312, with the one or more second characteristics (determined in conjunction with the step 406). That is, the processor 202 compares the one or more characteristics that are used for creating the statistical model and the one or more second characteristics corresponding to the real-time data. For example, the processor 202 may compare the location/scale of the lognormal distribution of accuracy, as determined in conjunction with the step 312, with the location/scale of the lognormal distribution of accuracy, obtained from the real-time data. Further, the processor 202 may perform such comparison for same combination of the values of the input parameters. That is, the processor 202 may compare the location of −5.523 (which corresponds to the combination: 0.1, 16, −1, 3, and 12 of input parameters) with the location (obtained from the real-time data) for the same combination of the input parameters (i.e., 0.1, 16, −1, 3, and 12). In an embodiment, the performance of the statistical model is considered satisfactory when the distribution of the values of the output parameters that are used for creating the statistical model and the second distribution are same. Further, in an embodiment, the performance of the statistical model is considered satisfactory when the comparison indicates that the one or more characteristics that are used for creating the statistical model and the one or more second characteristics corresponding to the real-time data are equal. In alternate embodiment, the performance of the statistical model is considered satisfactory when the comparison indicates that difference between the one or more characteristics that are used for creating the statistical model and the one or more second characteristics corresponding to the real-time data is less than a predetermined threshold.

It will be apparent to a person skilled in the art that the distribution of the values output parameters may change as more and more crowdsourcing tasks are executed on the crowdsourcing platform. For example, if the input parameters (e.g., task completion time or incentives) are changed for the crowdsourcing tasks, the distribution of the output parameters may also change. In an embodiment, to take care of such scenarios, the processor 202 may validate the goodness of the statistical model. If the processor 202 determines that the performance of the statistical model is satisfactory, step 410 is performed. If the processor 202 determines that the performance of the statistical model is not satisfactory, the step 308 is performed, i.e., the processor 202 may create the new statistical model, using the output parameters obtained from the real-time data. The processor 202 may create the new statistical model, as described in conjunction with the FIG. 3.

At step 410, the one or more characteristics associated with the distribution are stored. In an embodiment, if the processor 202 determines that the performance of the statistical model is satisfactory, the processor 202 may store the one or more characteristics, as determined in the step 312, in the database server 112. For example, the processor 202 may store the coefficients of the regression model in the database server 112.

In an embodiment, the coefficients of the regression model may be utilized to design the crowdsourcing tasks that optimize the performance of the crowdsourcing platform. For example, the requester may provide target values for the one or more output parameters, and the statistical model may determine the combination of the values of the input parameters, such that the distribution of the output parameters approaches the target values. As an example, if the requester wants a target value of the accuracy associated with an image analysis crowdsourcing task as 85%, the processor 202 may determine a combination of the values of the input parameters, such that the one or more characteristics (e.g., mean) associated with the accuracy approaches 85%. In a similar way, combination of the values of input parameters may be determined for optimizing other output parameters.

The disclosed embodiments encompass numerous advantages. Generally, in the crowdsourcing systems, performance may depend of various factors, such as, but not limited to, worker availability, incentive provided to the workers, compensations strategies deployed by the requesters, and so forth. Further, behavioral attributes associated with the crowdworkers also affect the performance of the crowdsourcing systems. For example, willingness of the crowdworker to attempt the tasks, skill-sets of the crowdworkers, intentions of the crowdworkers, motivation of the crowdworkers, etc. may also affect the performance of the crowdsourcing system. Typically, such interdependence between various factors (or behavioral attributes) and performance of the crowdsourcing systems is modeled through linear/nonlinear approaches that are deterministic in approach. That is, typically, for a given set of input parameters, the models provide fixed values of the output parameters. However, by providing the statistical model that captures the interdependence between the input parameters and the characteristics of the distribution, a range of the values of the output parameters may be optimized, instead of a single/fixed value. For example, the requesters may wish to optimize the average value (i.e., the mean) of the accuracy. In such a scenario, the determined statistical model, as disclosed above, may provide dependence between the combination of the input parameters and the mean of the accuracy. In addition, the requesters may utilize the statistical model to design the one or more crowdsourcing tasks, such that the performance of the crowdsourcing platform is optimized.

The disclosed methods and systems, as illustrated in the ongoing description or any of its components, may be embodied in the form of a computer system. Typical examples of a computer system include a general-purpose computer, a programmed microprocessor, a micro-controller, a peripheral integrated circuit element, and other devices, or arrangements of devices that are capable of implementing the steps that constitute the method of the disclosure.

The computer system comprises a computer, an input device, a display unit and the Internet. The computer further comprises a microprocessor. The microprocessor is connected to a communication bus. The computer also includes a memory. The memory may be Random Access Memory (RAM) or Read Only Memory (ROM). The computer system further comprises a storage device, which may be a hard-disk drive or a removable storage drive, such as, a floppy-disk drive, optical-disk drive, and the like. The storage device may also be a means for loading computer programs or other instructions into the computer system. The computer system also includes a communication unit. The communication unit allows the computer to connect to other databases and the Internet through an input/output (I/O) interface, allowing the transfer as well as reception of data from other sources. The communication unit may include a modem, an Ethernet card, or other similar devices, which enable the computer system to connect to databases and networks, such as, LAN, MAN, WAN, and the Internet. The computer system facilitates input from a user through input devices accessible to the system through an I/O interface.

In order to process input data, the computer system executes a set of instructions that are stored in one or more storage elements. The storage elements may also hold data or other information, as desired. The storage element may be in the form of an information source or a physical memory element present in the processing machine.

The programmable or computer-readable instructions may include various commands that instruct the processing machine to perform specific tasks, such as steps that constitute the method of the disclosure. The systems and methods described can also be implemented using only software programming or using only hardware or by a varying combination of the two techniques. The disclosure is independent of the programming language and the operating system used in the computers. The instructions for the disclosure can be written in all programming languages including, but not limited to, 'C', 'C++', 'Visual C++', Java, and 'Visual Basic'. Further, the software may be in the form of a collection of separate programs, a program module containing a larger program or a portion of a program module, as discussed in the ongoing description. The software may also include modular programming in the form of object-oriented programming. The processing of input data by the processing machine may be in response to user commands, the results of previous processing, or from a request made by another processing machine. The disclosure can also be implemented in various operating systems and platforms including, but not limited to, 'Unix', DOS', 'Android', 'Symbian', and 'Linux'.

The programmable instructions can be stored and transmitted on a computer-readable medium. The disclosure can also be embodied in a computer program product comprising a computer-readable medium, or with any product capable of implementing the above methods and systems, or the numerous possible variations thereof.

Various embodiments of the methods and systems for creating the statistical model have been disclosed. However, it should be apparent to those skilled in the art that modifications in addition to those described, are possible without departing from the inventive concepts herein. The embodiments, therefore, are not restrictive, except in the spirit of the disclosure. Moreover, in interpreting the disclosure, all terms should be understood in the broadest possible manner consistent with the context. In particular, the terms "comprises" and "comprising" should be interpreted as referring to elements, components, or steps, in a non-exclusive manner, indicating that the referenced elements, components, or steps may be present, or utilized, or combined with other elements, components, or steps that are not expressly referenced.

A person having ordinary skills in the art will appreciate that the system, modules, and sub-modules have been illustrated and explained to serve as examples and should not be considered limiting in any manner. It will be further appreciated that the variants of the above disclosed system elements, or modules and other features and functions, or alternatives thereof, may be combined to create other different systems or applications.

Those skilled in the art will appreciate that any of the aforementioned steps and/or system modules may be suitably replaced, reordered, or removed, and additional steps and/or system modules may be inserted, depending on the needs of a particular application. In addition, the systems of the aforementioned embodiments may be implemented using a wide variety of suitable processes and system modules and is not limited to any particular computer hardware, software, middleware, firmware, microcode, or the like.

The claims can encompass embodiments for hardware, software, or a combination thereof.

It will be appreciated that variants of the above disclosed, and other features and functions or alternatives thereof, may be combined into many other different systems or applications. Presently unforeseen or unanticipated alternatives, modifications, variations, or improvements therein may be subsequently made by those skilled in the art, which are also intended to be encompassed by the following claims.

What is claimed is:

1. A method for creating a performance statistical model for an image-analysis task on a crowdsourcing platform, the method comprising:

collecting, by one or more processors, values of at least one output parameter corresponding to each combination of values of a set of input parameters, wherein the at least one output parameter corresponds to at least one of a task accuracy, a task completion time, or a task acceptance rate, and the set of input parameters corresponds to at least one of a task-incentive associated with the image-analysis task, a playback speed associated with the image-analysis task, a country in which the image-analysis task is posted, a lifetime of the image-analysis task, time available to complete the image-analysis task, days of a week on which the image-analysis task is attempted, a time of the day when the image-analysis task is attempted, a recurrence of the image-analysis task, skill set associated with a crowdworker, availability of the crowdworker to perform the image-analysis task, motivation of the crowdworker in performing the image-analysis task, intentions of the crowdworker in performing the image-analysis task, and difficulty level of the image-analysis task;

determining, by the one or more processors, a distribution of the values of the at least one output parameter;

creating, by the one or more processors, the performance statistical model, based on the set of input parameters and one or more characteristics associated with the distribution of the values of the at least one output parameter; and validating, by the one or more processors, the performance statistical model, wherein the validation comprises:

estimating one or more second characteristics associated with a second distribution of values of the at least one output parameter, based on a real-time data associated with the image-analysis task;

comparing at least one of the distribution of the values of the at least one output parameter and the second distribution, or the one or more characteristics and the one or more second characteristics;

validating the performance statistical model based on the comparison; and creating a new performance statistical model utilizing the one or more second characteristics, based on the validation.

2. The method of claim 1 further comprising determining, by the one or more processors, the each combination of the values of the set of input parameters based on at least one of one or more design of experiments or a historical data.

3. The method of claim 2, wherein the one or more design of experiments correspond to at least one of a Full Factorial method, a Central Composite Design method, a Pseudo-Monte Carlo Sampling method, a Latin Hypercube Sampling method, or an Orthogonal Array Sampling method.

4. The method of claim 3 further comprising determining, by the one or more processors, a number of observations of the values of the set of input parameters, based on the one or more design of experiments.

5. The method of claim 1, wherein the distribution of the values of the at least one output parameter corresponds to at least one of an Exponential Distribution, an Extreme Value Distribution, a Lognormal Distribution, a Normal Distribution, a Rayleigh Distribution, a Beta Distribution, an F distribution, a Gamma Distribution, or a Weibull Distribution.

6. The method of claim 5, wherein the one or more characteristics associated with the distribution of the values of the at least one output parameter correspond to at least one of a shape of the distribution, a rate parameter of the distribution, a location parameter of the distribution, a scale parameter of the distribution, or d1/d2 parameter of the distribution.

7. The method of claim 1 further comprising determining, by the one or more processors, a modality of the distribution of the values of the at least one output parameter, wherein the modality of the distribution of the values of the at least one output parameter corresponds to at least one of a unimodal distribution, a bimodal distribution, or a multimodal distribution.

8. The method of claim 1 further comprising determining, by the one or more processors, one or more rules for an agent-based model, based on the performance statistical model.

9. The method of claim 8, wherein the one or more rules comprise at least one of a time for a crowdworker to search for the image-analysis task, a decision of the crowdworker to accept the image-analysis task, a quality of the image-analysis task performed by the crowdworker, a completion time of the image-analysis task performed by the crowdworker, a number of the crowdworkers interested in performing the image-analysis task, or information associated with the crowdworker.

10. The method of claim 1, wherein the performance statistical model is created by running a regression on the values of the set of input parameters and the one or more characteristics.

11. A method for creating a performance statistical model for a crowdsourcing platform, the method comprising:

collecting, by one or more processors, values of at least one output parameter corresponding to each combination of values of a set of input parameters, wherein the at least one output parameter and the set of input parameters are associated with one or more crowdsourcing tasks, and wherein the each combination of the values of the set of input parameters is determined based on at least one of one or more design of experiments or a historical data;

determining, by the one or more processors, a distribution of the values of the at least one output parameter;

creating, by the one or more processors, the performance statistical model, based on the values of the set of input parameters and one or more characteristics associated with the distribution of the values of the at least one output parameter; and validating, by the one or more processors, the performance statistical model, wherein the validation comprises:

estimating one or more second characteristics associated with a second distribution of values of the at least one output parameter, based on a real-time data associated with the image-analysis task;

comparing at least one of the distribution of the values of the at least one output parameter and the second distribution, or the one or more characteristics and the one or more second characteristics;

validating the performance statistical model based on the comparison; and creating a new performance statistical model utilizing the one or more second characteristics, based on the validation.

12. The method of claim 11, wherein the at least one output parameter corresponds to at least one of a task accuracy, a task completion time, or a task acceptance rate.

13. The method of claim 11, wherein the set of input parameters comprises at least one of a task-incentive associated with the one or more crowdsourcing tasks, a playback speed associated with the one or more crowdsourcing tasks, a country in which the one or more crowdsourcing tasks are posted, a lifetime of the one or more crowdsourcing tasks, time available to complete the one or more crowdsourcing tasks, days of a week on which the one or more crowdsourcing tasks are attempted, a time of the day when the one or more crowdsourcing tasks are attempted, a recurrence of the one or more crowdsourcing tasks, skill set associated with a crowdworker, availability of the crowdworker to perform the one or more crowdsourcing tasks, motivation of the crowdworker in performing the one or more crowdsourcing tasks, intentions of the crowdworker in performing the one or more crowdsourcing tasks, and difficulty level of the one or more crowdsourcing tasks.

14. The method of claim 11, wherein the one or more crowdsourcing tasks correspond to at least one of an image/video/text labelling/tagging/categorisation, language translation, data entry, handwriting recognition, product description writing, product review writing, essay writing, address look-up, website look-up, hyperlink testing, survey completion, consumer feedback, identifying/removing vulgar/illegal content, duplicate checking, problem solving, user testing, video/audio transcription, targeted photography (e.g. of product placement), text/image analysis, directory compilation, or information search/retrieval.

15. The method of claim 11, wherein the performance statistical model is created by running a regression on the values of the set of input parameters and the one or more characteristics.

16. A method for modeling behavioral characteristics associated with a crowdworker in a crowdsourcing platform, the method comprising:

collecting, by one or more processors, values of at least one output parameter corresponding to each combination of values of a set of input parameters, wherein the at least one output parameter and the set of input parameters are associated with one or more crowdsourcing tasks, and wherein the set of input parameters comprises one or more parameters indicative of the behavioral characteristics associated with the crowdworker;

determining, by the one or more processors, a distribution of the values of the at least one output parameter;

creating, by the one or more processors, a performance statistical model, based on the values of the set of input parameters and one or more characteristics associated with the distribution of the values of the at least one output parameter; and validating, by the one or more processors, the performance statistical model, wherein the validation comprises:

estimating one or more second characteristics associated with a second distribution of values of the at least one output parameter, based on a real-time data associated with the image-analysis task;

comparing at least one of the distribution of the values of the at least one output parameter and the second distribution, or the one or more characteristics and the one or more second characteristics;

validating the performance statistical model based on the comparison; and creating a new performance statistical model utilizing the one or more second characteristics, based on the validation.

17. The method of claim 16, wherein the one or more parameters indicative of the behavioral characteristics associated with the crowdworker comprise at least one of skill set associated with crowdworker, availability of the crowdworker to perform the one or more crowdsourcing tasks, motivation of the crowdworker, or intentions of the crowdworker in performing the one or more crowdsourcing tasks.

18. The method of claim 16, wherein the at least one output parameter corresponds to at least one of a task accuracy, a task completion time, or a task acceptance rate.

19. The method of claim 16, wherein the set of input parameters further comprises at least one of a task-incentive associated with the one or more crowdsourcing tasks, a playback speed associated with the one or more crowdsourcing tasks, a country in which the one or more crowdsourcing tasks are posted, a lifetime of the one or more crowdsourcing tasks, time available to complete the one or more crowdsourcing tasks, days of a week on which the one or more crowdsourcing tasks are attempted, a time of the day when the one or more crowdsourcing tasks are attempted, a recurrence of the one or more crowdsourcing tasks, or difficulty level of the one or more crowdsourcing tasks.

20. The method of claim 16, wherein the one or more crowdsourcing tasks correspond to at least one of an image/video/text labelling/tagging/categorisation, language translation, data entry, handwriting recognition, product description writing, product review writing, essay writing, address look-up, website look-up, hyperlink testing, survey completion, consumer feedback, identifying/removing vulgar/illegal content, duplicate checking, problem solving, user testing, video/audio transcription, targeted photography (e.g., of product placement), text/image analysis, directory compilation, or information search/retrieval.

21. The method of claim 16, wherein the performance statistical model is created by running a regression on the values of the set of input parameters and the one or more characteristics.

22. A system for creating a performance statistical model for a crowdsourcing platform, the system comprising:

one or more processors operable to:

collect values of at least one output parameter corresponding to each combination of values of a set of input parameters, wherein the at least one output parameter and the set of input parameters are associated with one or more crowdsourcing tasks, and wherein the each combination of the values of the set of input parameters is determined based on at least one of one or more design of experiments or a historical data;

determine a distribution of the values of the at least one output parameter;

create the performance statistical model, based on the values of the set of input parameters and one or more characteristics associated with the distribution of the values of the at least one output parameter; and validate the performance statistical model, wherein the validation comprises:

estimate one or more second characteristics associated with a second distribution of values of the at least one output parameter, based on a real-time data associated with the image-analysis task;

compare at least one of the distribution of the values of the at least one output parameter and the second distribution, or the one or more characteristics and the one or more second characteristics;

validate the performance statistical model based on the comparison; and create a new performance statistical model utilizing the one or more second characteristics, based on the validation.

23. The system of claim 22, wherein the at least one output parameter corresponds to at least one of a task accuracy, a task completion time, or a task acceptance rate.

24. The system of claim 22, wherein the set of input parameters comprises at least one of a task-incentive associated with the one or more crowdsourcing tasks, a playback speed associated with the one or more crowdsourcing tasks, a country in which the one or more crowdsourcing tasks are posted, a lifetime of the one or more crowdsourcing tasks, time available to complete the one or more crowdsourcing tasks, days of a week on which the one or more crowdsourcing tasks are attempted, a time of the day when the one or more crowdsourcing tasks are attempted, a recurrence of the one or more crowdsourcing tasks, skill set associated with a crowdworker, availability of the crowdworker to perform the one or more crowdsourcing tasks, motivation of the crowdworker in performing the one or more crowdsourcing tasks, intentions of the crowdworker in performing the one or more crowdsourcing tasks, and difficulty level of the one or more crowdsourcing tasks.

25. The system of claim 22, wherein the one or more crowdsourcing tasks correspond to at least one of an image/video/text labelling/tagging/categorisation, language translation, data entry, handwriting recognition, product description writing, product review writing, essay writing, address look-up, website look-up, hyperlink testing, survey completion, consumer feedback, identifying/removing vulgar/illegal content, duplicate checking, problem solving, user testing, video/audio transcription, targeted photography (e.g., of product placement), text/image analysis, directory compilation, or information search/retrieval.

26. The system of claim 22, wherein the performance statistical model is created by running a regression on the values of the set of input parameters and the one or more characteristics.

27. A computer program product for use with a computer, the computer program product comprising a non-transitory computer readable medium, wherein the non-transitory computer readable medium stores a computer program code for creating a performance statistical model for a crowdsourcing platform, wherein the computer program code is executable by one or more processors to:
- collect values of at least one output parameter corresponding to each combination of values of a set of input parameters, wherein the at least one output parameter and the set of input parameters are associated with one or more crowdsourcing tasks, and wherein the each combination of the values of the set of input parameters is determined based on at least one of one or more design of experiments or a historical data;
- determine a distribution of the values of the at least one output parameter;
- create the performance statistical model, based on the values of the set of input parameters and one or more characteristics associated with the distribution of the values of the at least one output parameter; and
- validate the performance statistical model, wherein the validation comprises:
  - estimate one or more second characteristics associated with a second distribution of values of the at least one output parameter, based on a real-time data associated with the image-analysis task;
  - compare at least one of the distribution of the values of the at least one output parameter and the second distribution, or the one or more characteristics and the one or more second characteristics;
  - validate the performance statistical model based on the comparison; and
  - create a new performance statistical model utilizing the one or more second characteristics, based on the validation.

* * * * *